United States Patent
Yu et al.

(10) Patent No.: US 6,841,466 B1
(45) Date of Patent: Jan. 11, 2005

(54) METHOD OF SELECTIVELY MAKING COPPER USING PLATING TECHNOLOGY

(75) Inventors: Chen-Hua Yu, Hsin-Chu (TW); Horng-Huei Tseng, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/672,395

(22) Filed: Sep. 26, 2003

(51) Int. Cl.[7] .................... H01L 21/44; H01L 21/4763
(52) U.S. Cl. .................. 438/622; 438/626; 438/633; 438/672; 438/678; 438/687
(58) Field of Search ................ 438/622, 626–628, 438/633–634, 637–640, 653, 672–675, 678, 685–688

(56) References Cited

U.S. PATENT DOCUMENTS

| | | | | |
|---|---|---|---|---|
| 5,666,007 A | * | 9/1997 | Chung ........................ 257/751 |
| 6,004,188 A | | 12/1999 | Roy ............................ 451/41 |
| 6,153,935 A | | 11/2000 | Edelstein et al. ........... 257/773 |
| 6,187,670 B1 | * | 2/2001 | Brown et al. ............... 438/638 |
| 6,417,095 B1 | | 7/2002 | Chen .......................... 438/633 |
| 6,420,258 B1 | | 7/2002 | Chen et al. ................. 438/622 |
| 6,441,492 B1 | | 8/2002 | Cunningham ............... 257/762 |
| 6,482,741 B1 | | 11/2002 | Ueno .......................... 438/687 |
| 6,509,267 B1 | | 1/2003 | Woo et al. .................. 438/687 |
| 6,528,426 B1 | | 3/2003 | Olsen et al. ................ 438/689 |
| 6,613,686 B2 | * | 9/2003 | Nishizama .................. 438/710 |

* cited by examiner

*Primary Examiner*—Thanh Nguyen
(74) *Attorney, Agent, or Firm*—Thomas, Kayden, Horstemeyer, & Risley

(57) ABSTRACT

A method of forming a more uniform copper interconnect layer is described. A dielectric layer, electroconductive (EC) layer, and a photoresist layer are sequentially deposited on a substrate. An opening in the photoresist is etched through the dielectric layer while the EC layer serves as a hard mask. Following deposition of a diffusion barrier layer and copper seed layer on the EC layer and in the opening, the copper seed layer is removed above the EC layer by a first CMP step. The EC layer serves as a CMP stop to protect the dielectric layer and provides a more uniform surface for subsequent steps. Copper is selectively deposited on the seed layer within the opening. A second CMP step lowers the copper layer to be coplanar with the dielectric layer and removes the EC layer. The resulting copper interconnect layer has a more uniform thickness and surface for improved performance.

32 Claims, 4 Drawing Sheets

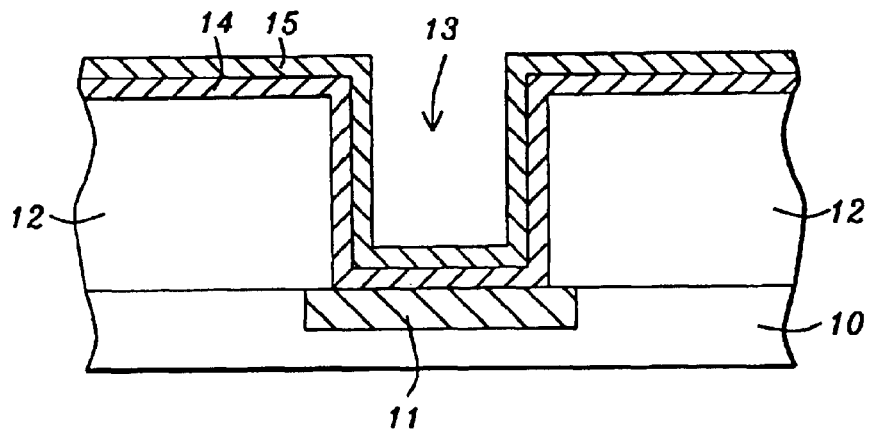
FIG. 1a – Prior Art
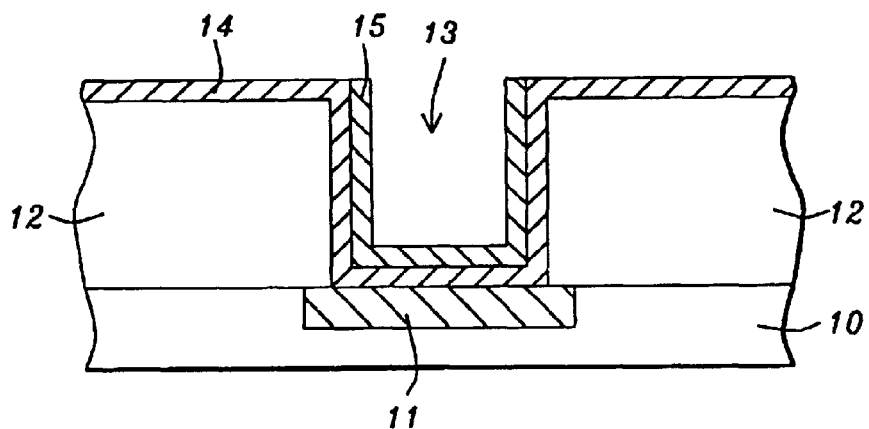
FIG. 1b – Prior Art
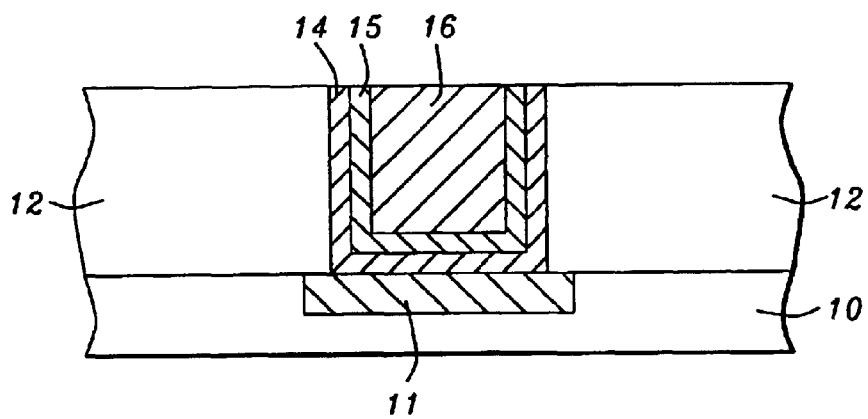
FIG. 1c – Prior Art

METHOD OF SELECTIVELY MAKING COPPER USING PLATING TECHNOLOGY

FIELD OF THE INVENTION

The invention relates to a method of fabricating a copper interconnect with improved performance and in particular to a method of forming an electroconductive layer that serves as a hard mask during an etch transfer step and as a stop layer during a chemical mechanical polish step.

BACKGROUND OF THE INVENTION

The manufacture of integrated circuits in a semiconductor device involves the formation of a sequence of layers that contain metal wiring. Metal wiring that forms interlevel and intralevel connections in a device is insulated by one or more dielectric layers in order to prevent crosstalk between the electrical pathways which can degrade device performance. A popular method of forming metal wiring is a damascene process in which a metal is deposited in an opening such as a via hole or a trench above a via in a dielectric layer. Usually, a conformal diffusion barrier layer is formed between the metal layer and dielectric layer to protect the metal from corrosion and oxidation and to prevent metal ions from migrating into the dielectric layer. The metal layer is typically planarized by a chemical mechanical polish (CMP) process.

Recent progress in forming metal interconnects includes lowering the resistivity of the metal by replacing aluminum with copper, decreasing the width of the vias and trenches with improved lithographic materials and processes to improve speed and performance, and reducing the dielectric constant (k) of insulating materials to minimize capacitance coupling between the metal interconnects. Current technology involves forming vias and trenches that have sub-micron dimensions which are generally below 0.30 microns. Some leading edge devices have critical dimensions that are 100 nm or less. Although $SiO_2$ which has a dielectric constant of about 4 has been widely used as a dielectric layer in older technologies, dielectric materials with a k value of less than about 3 are being implemented in new devices.

It should be noted that as the width of via holes or trench openings is shrinking in new technologies, the difficulty in forming a uniform thin diffusion barrier layer has resulted in adopting new techniques that include atomic layer deposition (ALD). For small holes, ALD is often preferred over chemical vapor deposition (CVD) methods for its improved gap filling capability and flexibility in composition by enabling a composite layer with three or more elements to be deposited in variety of monolayer sequences.

A recent advance in copper deposition as described in U.S. Pat. No. 6,420,258 involves a selective growth of copper by an electrochemical method on a conformal seed layer in a trench. The method reduces non-uniformity in metal CMP and thereby minimizes dishing at the top of the copper interconnect. However, a first CMP step that is used to remove the seed layer on the surface of the substrate can be difficult to control since the underlying diffusion barrier layer is frequently too thin to function as a good CMP stop.

A diffusion barrier cap is selectively deposited on a metal interconnect in U.S. Pat. No. 6,153,935 and provides corrosion protection and improved electromigration resistance. A barrier layer which is rhenium, rhodium, or ruthenium is formed on a copper interconnect in U.S. Pat. No. 6,441,492 and affords high resistance to Cu diffusion.

Dishing on a copper layer during a CMP step is avoided in U.S. Pat. No. 6,004,188 by employing a Ti/TiN sacrificial barrier layer on a dielectric layer, forming an opening in the dielectric layer, and depositing a Ta/TaN diffusion barrier liner in the opening prior to depositing a Cu layer. The copper level is lowered during a first CMP step that also removes the Ta/TaN above the dielectric layer at a relatively slow rate. Then a second CMP step planarizes the Cu while removing Ti/TiN at a similar rate. A sacrificial layer is also used in U.S. Pat. No. 6,417,095 and eliminates the need for a CMP step.

In U.S. Pat. No. 6,528,426, a SiC CMP stop layer is utilized to protect an underlying mechanically weak dielectric layer such as porous $SiO_2$. Conformal nitride and Ta barrier layers are formed on the sidewalls of a dielectric layer in U.S. Pat. No. 6,509,267 to prevent Cu from being sputtered onto the dielectric layer during a via etch.

A carbon electroconductive layer is formed on the sidewalls and bottom of an opening in an amorphous C and F containing dielectric layer by a plasma treatment in U.S. Pat. No. 6,482,741. The electroconductive layer functions as a diffusion barrier and as a seed growth layer for a copper layer. However, the method does not provide a means for preventing Cu dishing.

Therefore, an improved method of forming copper wiring is needed which involves a good stop layer during a first CMP step to remove a copper seed layer from selective portions of the substrate. The method should also prevent dishing during a second CMP step to planarize a copper interconnect layer that is formed in an opening within a dielectric layer by an electrochemical process. The method should also be compatible with incorporation of a diffusion barrier layer between the copper layer and the dielectric layer.

SUMMARY OF THE INVENTION

An objective of the present invention is to provide an improved method for fabricating copper wiring that affords good CMP uniformity during planarization of a copper interconnect layer.

A further objective of the present invention is to provide an improved method of forming copper wiring that involves an electrochemical deposition and which prevents a CMP step used to polish a copper seed layer from punching through a diffusion barrier layer into a dielectric layer.

A still further objective of the present invention is to provide an electroconductive layer that can serve as a hard mask and CMP stop layer in a damascene scheme.

These objectives are achieved by incorporating an electroconductive layer in a damascene scheme. A substrate is provided that typically has a first metal layer with an exposed upper surface. An etch stop layer and dielectric layer are sequentially formed on the substrate. An electroconductive layer is deposited by a chemical vapor deposition (CVD), plasma enhanced CVD, or physical vapor deposition (PVD) "sputtering" method on the dielectric layer and will serve as a hard mask during a subsequent plasma etch process. A photoresist is coated and patterned to form an opening such as a trench or via hole on the electroconductive layer. Then the opening is transferred through the underlying layers with a plasma etch process and exposes a portion of the first metal layer. Alternatively, the opening may be a trench formed above a via hole in a dual damascene fabrication.

A conformal diffusion barrier layer is deposited on the electroconductive (EC) layer and on the sidewalls and bottom of the opening. Next, a copper seed layer is formed on the diffusion barrier layer and is removed above the EC layer by a first CMP step. The presence of the EC layer prevents the first CMP process from eroding the dielectric layer in situations where the thin diffusion layer is entirely removed above the dielectric layer. The EC layer functions as a stop layer since it preferably has a slower polish rate than the adjacent diffusion barrier layer and copper seed layer. A copper layer that will become an interconnect is selectively deposited by an electrochemical process on the remaining copper seed layer to fill the opening. A second CMP step is performed to lower the level of the copper layer until it is coplanar with the dielectric layer. In so doing, the EC layer and the diffusion barrier layer above the dielectric layer are removed and a copper interconnect is completed with good uniformity and improved performance.

In a second embodiment, the first CMP step is used to remove the copper seed layer and the diffusion barrier layer above the dielectric layer. The EC layer on the top surface of the dielectric layer ensures that the entire surface of the substrate is electroconductive to enable a selective electrochemical copper deposition to occur in a subsequent step. A copper layer is formed on the remaining seed layer in the opening with a selective electrochemical deposition as described in the first embodiment. A second CMP step then planarizes the copper layer to form an interconnect and also removes the EC layer.

BRIEF DESCRIPTION OF THE DRAWINGS

The object and other advantages of this invention are best described in the preferred embodiments with reference to the attached drawings that include:

FIGS. 1a–1c which are cross-sectional views depicting a prior art method of planarizing a copper seed layer that is formed as part of a damascene structure.

DETAILED DESCRIPTION OF THE INVENTION

Figure 2:
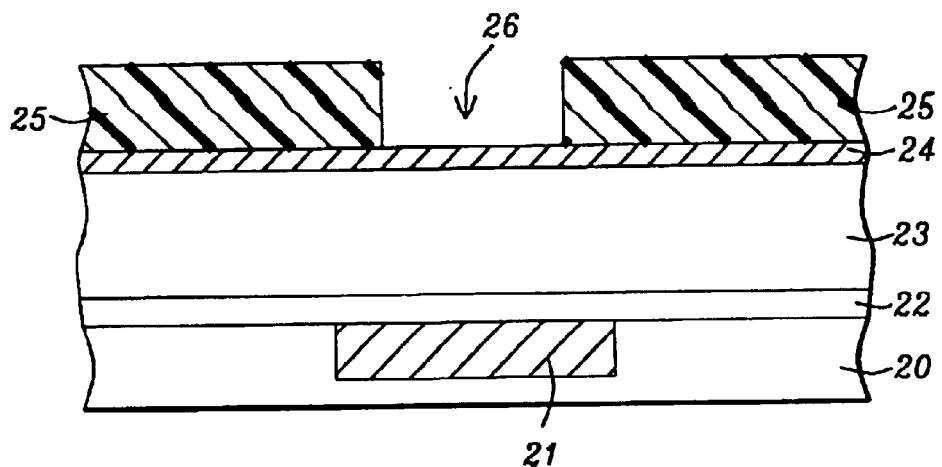
FIGS. 2–7 which are cross-sectional views illustrating the formation of a copper interconnect by employing an electroconductive layer according to one embodiment of the present invention.

The present invention is particularly useful in forming metal wiring with improved uniformity and high performance in an integrated circuit that is part of a microelectronic device. Preferably, the metal is copper and the copper wiring may be in the form of an interconnect that is fabricated by a single or dual damascene scheme. However, another metal or a metal alloy may be used to form an interconnect. A first embodiment is depicted in FIGS. 2–7. Although the figures depict a single damascene sequence, it should be understood that the invention is equally effective in a dual damascene method that involves a via first approach where a trench is formed above a via. Furthermore, the figures are not necessarily drawn to scale and are not intended to limit the scope of the invention.

As a background to the present invention, the inventors have previously practiced a copper wiring method as represented in FIGS. 1a–1c. Referring to FIG. 1a, a substrate 10 is provided that is typically silicon and which contains a conductive layer 11 with an exposed surface. There may be other conductive and dielectric layers in substrate 10 that are not shown in order to simplify the drawing.

A dielectric layer 12 is formed on substrate 10 by a CVD, PECVD, or spin-on method. Next, an opening 13 such as a trench or via is formed in dielectric layer 12 by a conventional method. A diffusion barrier layer 14 comprised of TaN, Ti/TiN, TiN, or WN is deposited with a PVD process followed by deposition of a copper seed 15 layer using a PVD technique.

Referring to FIG. 1b, a first CMP step is employed to remove the copper seed layer 15 above dielectric layer 12. A continuous diffusion barrier layer 14 remains in order to enable a subsequent selective copper electrochemical deposition to proceed. Since the diffusion barrier layer 14 may be as thin as 100 Angstroms, the polish step may remove barrier layer 14 in some regions of substrate 10 and begin to thin dielectric layer 12. This action can produce scratches on dielectric layer 12 which can lead to a loss in device performance. Moreover, dielectric layer 12 can become thinner in some regions of the substrate than in others because of some non-uniformity in the CMP process. The resulting lack of planarity will cause a subsequent copper deposition process to form copper wiring with variable thickness in the non-planar dielectric layer 12 which in turn will have a deleterious effect on device performance. For example, copper sheet resistance (Rs) is proportional to the cross-sectional area of a copper line. Therefore, copper Rs will vary across a substrate when dielectric layer 12 is not planar.

In FIG. 1c, a copper layer 16 is deposited on copper seed layer 15 in opening 13 by a selective electrochemical process. A second CMP step is used to remove diffusion barrier layer 14 above dielectric layer 12 and lower the level of copper layer 16 to be coplanar with dielectric layer 12. When dielectric layer 12 in the vicinity of opening 13 is thinner than desired by over polishing during the first CMP step, the resulting copper layer 16 in opening 13 will have a thickness below a specified limit. Therefore, a method which provides better thickness control of dielectric layer 12 during planarization of copper seed layer 15 is necessary.

The inventors have discovered that an electroconductive (EC) layer when incorporated into a copper wiring fabrication sequence provides a method of controlling a subsequent planarization step of a copper seed layer and thereby improves copper wiring uniformity and device performance. In its simplest form, the present invention involves filling an opening in a dielectric layer on a substrate with a uniform metal layer. The preferred embodiments are described according to a damascene scheme. A first embodiment is shown in FIGS. 2–7.

Referring to FIG. 2, a substrate 20 is provided that is typically silicon but may be based on silicon-on-insulator, silicon germanium, or gallium-arsenide technology. Substrate 20 has a conductive layer 21 with an exposed surface that may be enclosed on the sides and bottom by a diffusion barrier layer (not shown) in order to prevent corrosion and oxidation of conductive layer 21. Substrate 20 may be comprised of insulating layers and other conductive layers which are not shown in order to simplify the drawing.

An etch stop layer 22 that is comprised of silicon nitride, silicon oxynitride, or silicon carbide is deposited on substrate 20 by a CVD or PECVD process. A dielectric layer 23 having a thickness of from 1000 to 10000 Angstroms is then formed by a CVD, PECVD, or spin-on technique. The dielectric layer 23 is $SiO_2$ or preferably is a low dielectric constant (k) material with a k value of less than about 3.5 and more preferably, k is less than 3. Examples of a low k material that may be used in dielectric layer 23 are fluorine doped $SiO_2$ (fluorosilicate glass), carbon doped $SiO_2$, nitrogen doped $SiO_2$, polysilsesquioxanes such as HSQ and MSQ, polyarylethers, benzocyclobutene (BCB), borophosphosilicate glass, and fluorinated polyimides. Dielectric layer 23 may be annealed at temperatures of up to 600° C. to remove trace amounts of water and other impurities. Furthermore, the dielectric layer 23 may be subjected to a plasma treatment known to those skilled in the art to densify the layer and thereby stabilize a low k dielectric constant and prevent water uptake.

A key feature of this invention is the deposition of an EC layer 24 having a thickness in the range of about 50 to 2000 Angstroms and preferably 50 to 1000 Angstroms on dielectric layer 23 by a PVD or CVD process. EC layer 24 is selected from a group of materials including W, Al, WN, Ti, and TiN. Alternatively, EC layer 24 may be a metal compound, metal alloy, or an amorphous metal that is a good electrical conductor and which can function as a stop layer in a copper CMP process and as a hard mask during a pattern transfer with an oxygen based plasma etch.

A photoresist layer 25 is coated on EC layer 24 and is patterned by conventional means using an exposure tool and one or more exposure wavelengths from about 10 to 600 nm to form an opening 26 that is aligned above conductive layer 21. Alternatively, the exposure tool is a projection electron beam tool. Opening 26 may be a via hole or trench and preferably has a width that is about 200 nm or less and may be 100 nm or less in newer technology devices. Note that while FIG. 2 shows one opening 26 in photoresist layer 25 above one conductive layer 21, other designs are possible including the formation of more than one opening over a conductive layer 21.

Figure 3:
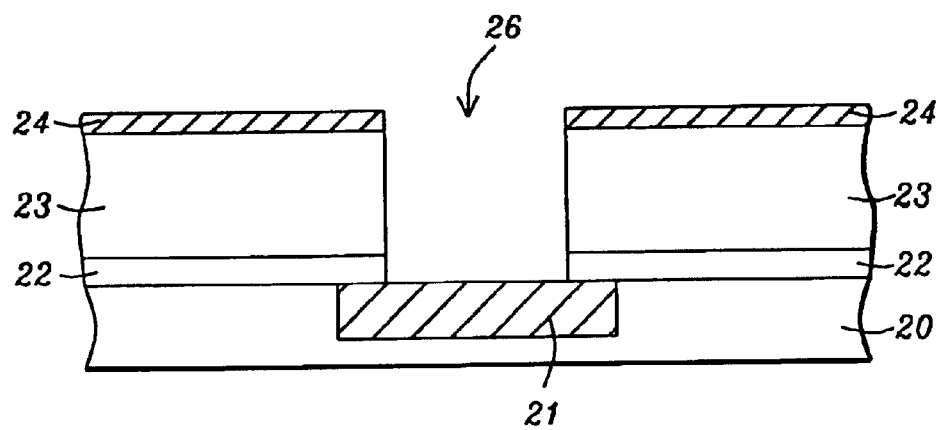

Referring to FIG. 3, the opening 26 is transferred through EC layer 24, dielectric layer 23, and etch stop 22 by one or more plasma etch steps that are known to those skilled in the art. Photoresist layer 25 may be totally consumed by the transfer step through dielectric layer 23 or during the etch through etch stop 22. In situations where photoresist layer 25 is consumed before conductive layer 21 is exposed at the bottom of opening 26, EC layer 24 functions as a hard mask to protect underlying dielectric layer 23. A hard mask capability in EC layer 24 is especially valuable when dielectric layer 23 has an organic (C, H) component that is susceptible to an oxygen containing plasma etch. Therefore, EC layer 24 should have a low etch rate in an oxygen based plasma and metal oxides formed during the plasma etch are preferably volatile to avoid undesirable residues. A standard wet clean process may be used to remove organic residues following the plasma etch transfer of opening 26 to expose conductive layer 21.

Figure 4:
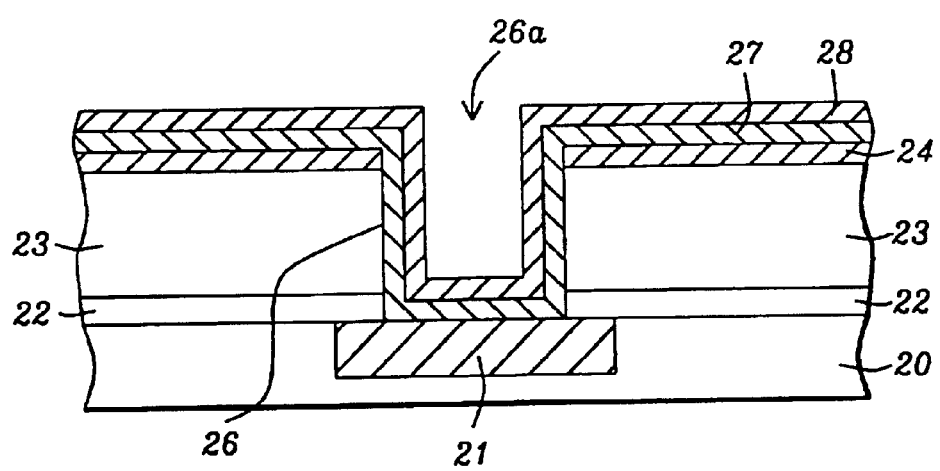

Referring to FIG. 4, a diffusion barrier layer 27 that is preferably conformal and having a thickness of about 20 to 500 Angstroms is deposited on EC layer 24 and on the sidewalls and bottom of opening 26. In one embodiment, diffusion barrier layer 27 is a comprised of Ta, TaN, Ti, TiN, TiSiN, TaSiN, W, WN, or an amorphous metal and is deposited with a CVD, PECVD, physical vapor deposition (PVD) or atomic layer deposition (ALD) method.

Note that while EC layer 24 and diffusion barrier layer 27 may contain the same material, the two layers are typically different materials since the diffusion barrier layer is selected for good adhesion to copper and as a barrier to copper ions while an EC layer is chosen for adhesion to an underlying dielectric layer, to provide good etch resistance during the pattern transfer process, and for its relatively low polish rate during copper CMP. In an exemplary process, W may be preferred as an EC layer while Ta or TaN is selected as the diffusion barrier layer.

A copper seed layer 28 is then deposited on diffusion barrier 27 by a PVD, PECVD, or ALD method, depending on the width of the opening 26. Copper seed layer 28 is also a conformal coating and has a thickness of about 10 to 1000 Angstroms. As a result, an opening 26a is formed inside the original opening 26.

Figure 5:
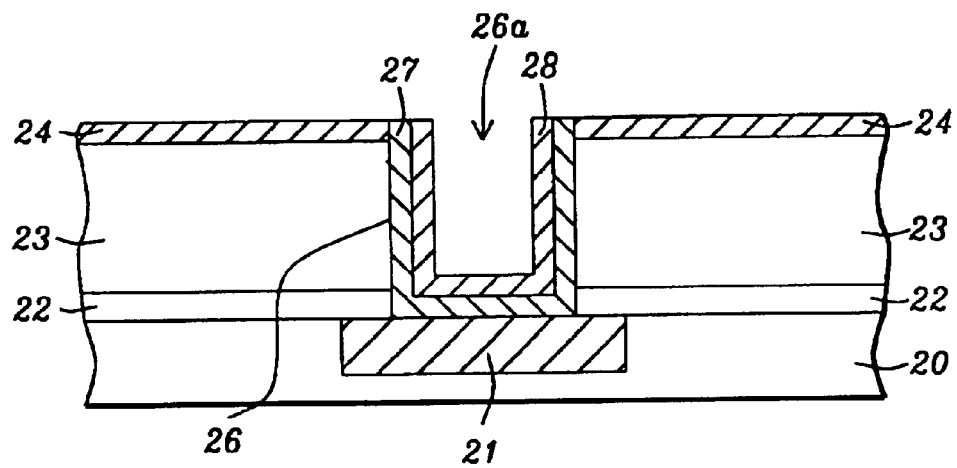

The first embodiment is continued in FIG. 5 by employing a planarization method such as a first CMP process, for example, to remove copper seed layer 28 above EC layer 24. Conditions for performing the first CMP process are well known to those who practice the art and are not described herein. Note that the thin diffusion barrier metal layer 27 is also removed above EC layer 24 in this embodiment. In this case, the EC layer 24 is selected because it is a good CMP stop and preferably has a polishing rate that is less than the polishing rate for diffusion barrier layer 27. Copper is relatively soft and Cu seed layer 28 has a polish rate that is usually higher than the removal rate of diffusion barrier layer 27. EC layer 24 may be thinned somewhat during the first CMP process but its polish rate is low enough to ensure a continuous coverage of dielectric layer 23. The top surfaces of diffusion barrier layer 27 and copper seed layer 28 within opening 26 are now coplanar with EC layer 24.

Figure 6:
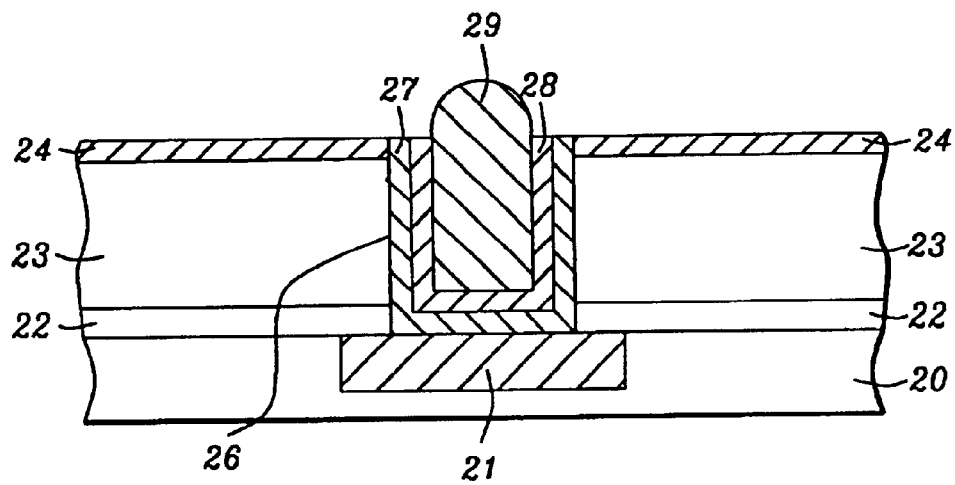

Referring to FIG. 6, a selective electrochemical deposition similar to the method described in U.S. Pat. No. 6,420,258 is performed to grow a copper layer 29 on copper seed layer 28 and provide a good Cu seal in opening 26a. Copper layer 29 forms only on copper seed layer 28 and fills opening 26a. Although copper layer 29 is shown as a distinct layer on copper seed layer 28 for illustrative purposes, copper layer 29 and copper seed layer 28 are typically not distinguishable from one another. Note that copper layer 29 extends slightly above the top surface of diffusion barrier layer 27.

Figure 7:
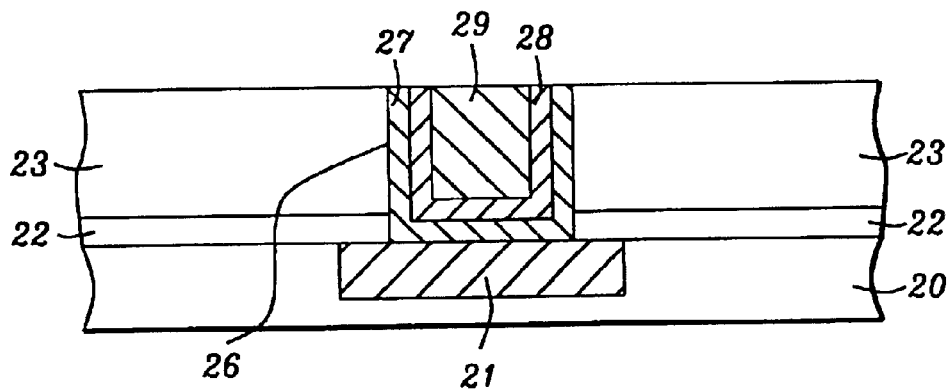

Referring to FIG. 7, a copper interconnect comprised of copper layer 29 and copper seed layer 28 is completed by a planarization step. For example, a second CMP process similar to the first CMP process is used to planarize copper layer 29 to be coplanar with dielectric layer 23. The second CMP process also removes EC layer 24 and the top portions of diffusion barrier layer 27 and copper seed layer 28 in opening 26. Since only a thin portion of copper layer 29 is removed, the second CMP process is capable of planarizing the copper layer with little or no dishing.

The copper interconnect comprised of copper layer 29 and copper seed layer 28 in opening 26 and other copper interconnects (not shown) that are fabricated in other openings within dielectric layer 23 are more uniformly formed than in prior art because EC layer 24 controls the first CMP process to afford a more uniform height of a copper seed layer within the aforementioned openings. Copper layer 29 and other copper wiring in dielectric layer 23 is fabricated at a more uniform height than previously achieved which thereby affords a more uniform copper sheet resistance (Rs) across the substrate 20 and imparts a higher performance to the microelectronic device. In addition, a conventional CMP step that removes a continuous thick copper layer above dielectric layer 23 on substrate 20 is eliminated in the present invention. The two CMP steps in the present invention require less consumables than a conventional CMP process and are considered a cost savings measure. The method of the present invention provides an advantage in that the two CMP steps are more highly controlled than a conventional CMP step and thereby afford a device with less dishing in the copper layer and higher reliability.

A second embodiment is shown in FIGS. 2–4 and FIGS. 7–9 and provides an alternative approach in utilizing an EC layer during the fabrication of a copper interconnect. A description of FIGS. 2–4 was given previously in the first embodiment wherein an opening 26 is formed in a stack of layers comprised of an upper EC layer 24, a middle dielectric layer 23, and a lower etch stop layer 22 on a substrate 20. EC layer 24 can serve as a hard mask during the etch transfer of opening 26 through the stack of exposed layers 22, 23, 24 to protect an underlying dielectric layer 23 comprised of organic (C,H) components. Opening 26 is aligned above a conductive layer 21 in substrate 20. A conformal diffusion barrier layer 27 is formed in opening 26 and on EC layer 24 followed by deposition of a conformal copper seed layer 28 on diffusion barrier layer 27 as mentioned in the first embodiment. A smaller opening 26a is now located within the original opening 26.

Figure 8:
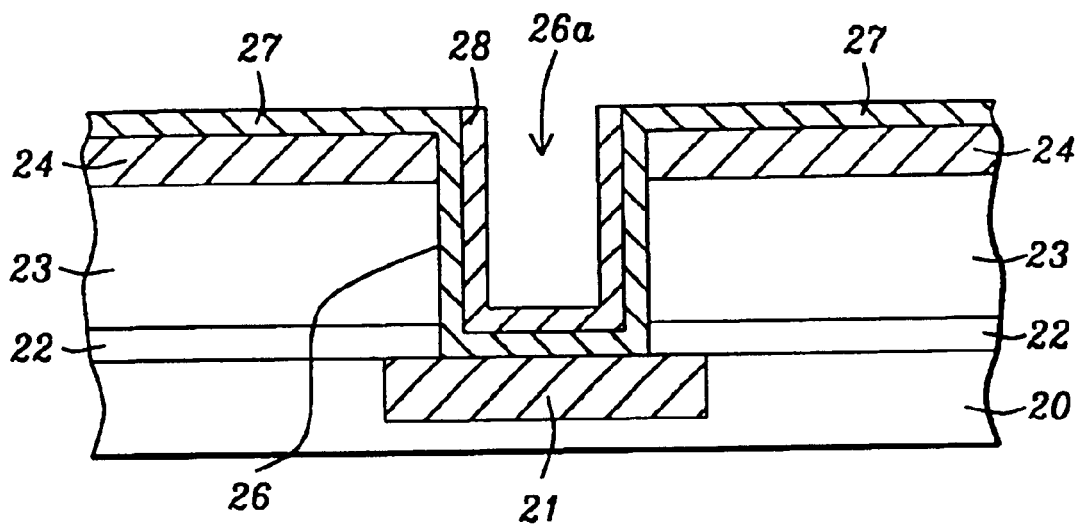
FIGS. 8–9 which are cross-sectional views showing the planarization of a copper seed layer during the formation of a copper interconnect according to a second embodiment of the present invention.

Referring to FIG. 8, a first planarization step that is a CMP process, for example, is performed to remove the copper seed layer 28 above EC layer 24. The CMP process stops on diffusion barrier layer 27. In some regions of the substrate, the CMP step may break through the thin diffusion barrier layer 27 because of some nonuniformity in the polishing process. In this case, EC layer 24 serves as a stop layer to prevent the CMP step from penetrating into the dielectric layer 23 and causing scratches or dishing that can detract from device performance.

Figure 9:
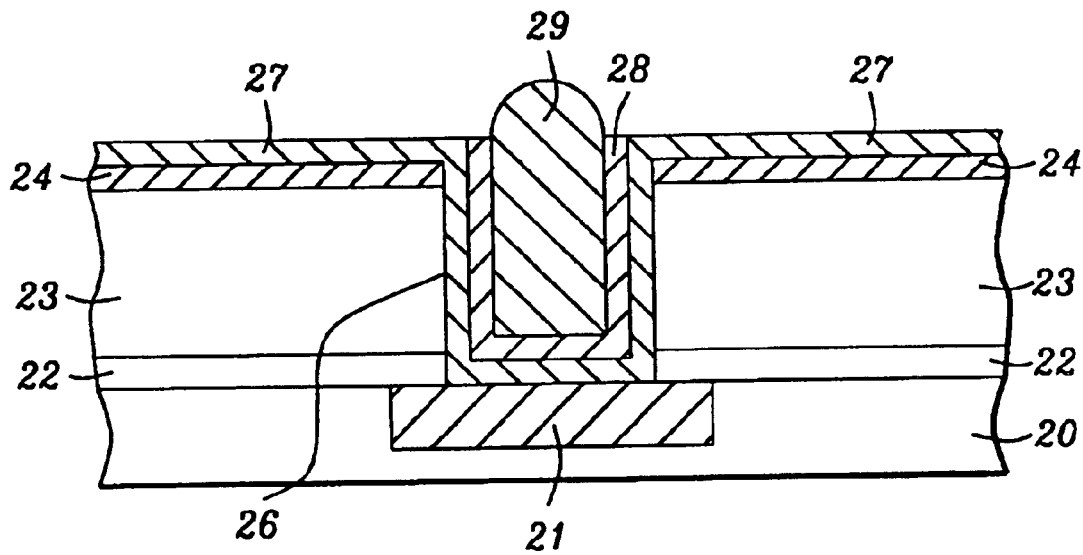

Referring to FIG. 9, a selective electrochemical deposition similar to the method described in U.S. Pat. No. 6,420,258 is performed to grow a copper layer 29 on copper seed layer 28 and provide a good Cu seal in opening 26. Copper layer 29 forms only on copper seed layer 28 and fills opening 26a. Note that copper layer 29 extends slightly above the surface of diffusion barrier layer 27.

Returning to FIG. 7, a copper interconnect comprised of copper layer 29 and copper seed layer 28 is completed by a second planarization process. For example, a second CMP step similar to the first CMP step is used to lower the level of copper layer 29 to be coplanar with dielectric layer 23. The second CMP step also removes EC layer 24 and diffusion barrier layer 27 above dielectric layer 23 and removes a top portion of copper seed layer 28. Since only a thin portion of copper layer 29 is removed, the amount of dishing is substantially reduced compared to a conventional CMP step where a continuous thick copper layer must be thinned.

The copper interconnect comprising copper layer 29 and copper seed layer 28 in opening 26 and other copper interconnects (not shown) that are fabricated in other openings within dielectric layer 23 are more uniformly formed than in prior art because EC layer 24 helps to control the first CMP step to afford a more uniform height of a copper seed layer within the aforementioned openings and a more uniform thickness of dielectric layer 23 across the substrate 20. Copper layer 29 and other copper wiring in dielectric layer 23 is fabricated at a more uniform height than previously achieved which results in a more uniform copper sheet resistance substrate 20 and a higher performance to the microelectronic device.

While this invention has been particularly shown and described with reference to, the preferred embodiments thereof, it will be understood by those skilled in the art that various changes in form and details may be made without departing from the spirit and scope of this invention. For instance, the method of the first or second embodiment may be performed more than once on a substrate to build a multilevel copper interconnect structure in which a copper layer on one level is electrically connected to one or more underlying copper layers.

We claim:

1. A method of fabricating an integrated circuit on a substrate, comprising:
    (a) providing a semiconductor substrate with a dielectric layer formed thereon;
    (b) forming an electroconductive layer on said dielectric layer;
    (c) forming a pattern comprised of an opening in said electroconductive layer that extends through said dielectric layer;
    (d) depositing a diffusion barrier layer on said electroconductive layer and within said opening;
    (e) depositing a metal seed layer on said diffusion barrier layer;
    (f) removing said metal seed layer above said electroconductive layer by a first planarization process;
    (g) forming a metal layer on the metal seed layer by a selective electrochemical deposition to fill said opening and
    (h) performing a second planarization process so that said metal layer becomes coplanar with said dielectric layer.

2. The method of claim 1 wherein the dielectric layer is comprised of a low k dielectric material that is fluorine doped SiO2, carbon doped SiO2, nitrogen doped $SiO_2$, borophosphosilicate glass, a poly(arylether), a polysilsesquioxane, benzocyclobutene, or a fluorinated polyimide and has a thickness of about 1000 to 10000 Angstroms.

3. The method of claim 1 wherein said opening has a width of about 200 nm or less.

4. The method of claim 1 wherein said electroconductive layer is selected from a group of materials including W, Al, WN, Ti, and TiN.

5. The method of claim 1 wherein said electroconductive layer is a metal compound, a metal alloy, or an amorphous metal that is a good electrical conductor and which can function as a stop layer in a copper CMP process and as a hard mask during an oxygen based plasma etch to form said opening.

6. The method of claim 1 wherein said electroconductive layer has a thickness in the range of about 50 to 1000 Angstroms.

7. The method of claim 1 wherein said electrochemical layer is formed by a physical vapor deposition (PVD) or chemical vapor deposition (CVD) process.

8. The method of claim 3 wherein said opening is formed by patterning a photoresist layer on the electroconductive layer and transferring said opening through the electroconductive layer and dielectric layer by one or more plasma etch steps.

9. The method of claim 1 wherein said substrate is further comprised of a conductive layer and an etch stop layer formed on said conductive layer.

10. The method of claim 9 wherein the opening in said dielectric layer is transferred through said etch stop layer by a plasma etch step to expose a portion of said conductive layer before the diffusion layer is deposited.

11. The method of claim 1 wherein said diffusion barrier layer has a thickness of about 20 to 500 Angstroms and is deposited by a CVD, plasma enhanced CVD (PECVD), PVD, or atomic layer deposition (ALD) technique.

12. The method of claim 1 wherein said metal seed layer is a copper layer with a thickness of about 10 to 1000 Angstroms and is deposited by a PVD, CVD, or ALD process.

13. The method of claim 1 wherein first and second planarization processes are accomplished by a chemical mechanical polish (CMP) process.

14. The method of claim 1 wherein the first planarization process removes the diffusion barrier layer and metal seed layer above said electroconductive layer.

15. The method of claim 14 wherein said electroconductive layer has a polish rate that is lower than said diffusison barrier layer and functions as a CMP stop layer.

16. The method of claim 1 wherein said metal layer is copper.

17. A method of forming a uniform copper interconnect layer on a substrate, comprising:
(a) providing a substrate having a stack of layers formed thereon, said stack is comprised of a bottom etch stop layer, a middle dielectric layer, and an upper electroconductive layer;
(b) forming a pattern comprised of an opening in said electroconductive layer that extends through said dielectric layer and said etch stop layer;
(c) depositing a diffusion barrier layer on said electroconductive layer and within said opening;
(d) depositing a copper seed layer on said diffusion barrier layer;
(e) removing said copper seed layer above said electroconductive layer by a first planarization process;
(f) forming a copper layer on the copper seed layer by a selective electrochemical deposition to fill said opening; and
(g) performing a second planarization process so that said copper layer becomes coplanar with said dielectric layer.

18. The method of claim 17 wherein the dielectric layer is comprised of a low k dielectric material that is fluorine doped SiO2, carbon doped $SiO_2$, nitrogen doped SiO2, borophosphosilicate glass, a poly(arylether), a polysilsesquioxane, benzocyclobutene, or a fluorinated polyimide and has a thickness of about 1000 to 10000 Angstroms.

19. The method of claim 17 wherein said opening has a width of about 200 nm or less.

20. The method of claim 17 wherein said electroconductive layer is selected from a group of materials including W, Al, WN, Ti, and TiN.

21. The method of claim 17 wherein said electroconductive layer is a metal compound, a metal alloy, or an amorphous metal that is a good electrical conductor and which can function as a stop layer in a copper CMP planarization process an~as a hard mask during an oxygen based plasma etch to form said opening.

22. The method of claim 17 wherein said electroconductive layer has a thickness in the range of about 50 to 2000 Angstroms.

23. The method of claim 17 wherein said electroconductive layer is formed by a PVD or CVD process.

24. The method of claim 17 wherein said opening is formed by patterning a photoresist layer on the electroconductive layer and transferring said opening through the electroconductive layer, dielectric layer, and etch stop layer by one or more plasma etch steps.

25. The method of claim 17 wherein said substrate is further comprised of a conductive layer and wherein said opening exposes a portion of said conductive layer.

26. The method of claim 17 wherein said diffusion barrier layer has a thickness of about 20 to 500 Angstroms and is deposited by a CVD, plasma enhanced CVD, PVD, or ALD technique.

27. The method of claim 17 wherein said copper seed layer is deposited by a PVD CVD, or ALD process.

28. The method of claim 17 wherein said first and second planarization processes comprise a CMP process.

29. The method of claim 17 further comprised of removing said diffusion barrier layer above said electroconductive layer during said first planarization process.

30. The method of claim 29 wherein said electroconductive layer has a polish rate that is lower than said diffusion barrier layer and functions as a CMP stop layer.

31. The method of claim 17 wherein said electroconductive layer and the top portions of said diffusion barrier layer and copper seed layer in said opening are removed during said second planarization process to yield a uniform thickness of said copper layer within said opening.

32. The method of claim 17 wherein said pattern is further comprised of other openings and a uniform copper wiring thickness is formed within all openings in said pattern.

\* \* \* \* \*